(12) United States Patent
Allen et al.

(10) Patent No.: US 7,675,776 B2
(45) Date of Patent: Mar. 9, 2010

(54) BIT MAP CONTROL OF ERASE BLOCK DEFECT LIST IN A MEMORY

(75) Inventors: Walter Allen, Wellington, CO (US); Robert France, Austin, TX (US); Sunil Atri, Austin, TX (US)

(73) Assignee: Spansion, LLC, Sunnyvale, CA (US)

( * ) Notice: Subject to any disclaimer, the term of this patent is extended or adjusted under 35 U.S.C. 154(b) by 3 days.

(21) Appl. No.: 11/963,286

(22) Filed: Dec. 21, 2007

(65) Prior Publication Data

US 2009/0161430 A1    Jun. 25, 2009

(51) Int. Cl.
G11C 16/06    (2006.01)
(52) U.S. Cl. .............. 365/185.09; 365/200; 365/185.11
(58) Field of Classification Search ............ 365/185.09, 365/185.11, 200
See application file for complete search history.

(56) References Cited

U.S. PATENT DOCUMENTS

| | | | | |
|---|---|---|---|---|
| 5,838,614 A * | 11/1998 | Estakhri et al. | ........ | 365/185.11 |
| 5,864,661 A * | 1/1999 | Ohara | .......................... | 714/42 |
| 6,128,695 A * | 10/2000 | Estakhri et al. | ............. | 711/103 |
| 6,393,513 B2 * | 5/2002 | Estakhri et al. | ............. | 711/103 |
| 6,772,274 B1 * | 8/2004 | Estakhri | ...................... | 711/103 |
| 7,173,852 B2 * | 2/2007 | Gorobets et al. | ....... | 365/185.09 |
| 7,379,331 B2 * | 5/2008 | Kasai et al. | ............ | 365/185.09 |
| 7,434,122 B2 * | 10/2008 | Jo | ............................... | 714/723 |
| 7,444,460 B2 * | 10/2008 | Nakanishi et al. | ........... | 711/103 |
| 7,453,712 B2 * | 11/2008 | Kim et al. | ..................... | 365/63 |
| 7,457,897 B1 * | 11/2008 | Lee et al. | ...................... | 710/74 |

FOREIGN PATENT DOCUMENTS

| | | | | |
|---|---|---|---|---|
| JP | 363000863 A | * | 1/1988 | |
| JP | 407014398 A | * | 1/1995 | |
| JP | 409186834 A | * | 7/1997 | |
| JP | 02003109396 A | * | 4/2003 | |
| JP | 02006048893 A | * | 2/2006 | |
| JP | 02007179594 A | * | 7/2007 | |
| WO | WO95/10083 | * | 4/1995 | |

* cited by examiner

*Primary Examiner*—Viet Q Nguyen
(74) *Attorney, Agent, or Firm*—Turocy & Watson, LLP

(57) ABSTRACT

Systems and methods that facilitate bad block management in a memory device that comprises nonvolatile memory are presented. One or more memory blocks of a memory device are each associated with one or more additional, dedicated bits that facilitate indicating whether the associated memory block is defective. These additional bits, called bad block bits, can be stored in a hardware-based storage mechanism within the memory device. Once a defect is detected in a memory block, at least one of the associated bad block bits can be set to indicate that the memory block is defective. If at least one of the bad block bits associated with a memory block indicates a memory block is defective, access to the memory block can be prevented.

20 Claims, 10 Drawing Sheets

BIT MAP CONTROL OF ERASE BLOCK DEFECT LIST IN A MEMORY

TECHNICAL FIELD

The subject innovation relates to semiconductor devices, and more particularly, to non-volatile memory devices.

BACKGROUND

Memory devices increasingly contain one or more defective memory blocks. For example, with NOR and NAND flash technology moving to small lithography defects in flash blocks are increasing. In addition to manufacturing related defects, memory blocks can wear out over time and become defective. As a result, defective memory blocks are typically identified and managed so that user data is written or transferred to the remaining good memory blocks of the memory device. Thus, data integrity is maintained despite the presence of one or more defective memory blocks.

Conventionally, the task of managing these defective memory blocks falls onto software, such as a file system software or driver software. However, software implementations usually suffer from a number of problems. For example, software often stores the locations of bad blocks in volatile memory and writes a defect list to a memory block on power off. Thus, if a power loss occurs, the current bad block list may not be saved. In addition, a software implementation adds to the complexity of designing and maintaining the software.

Furthermore, traditionally, the defect list used by a software implementation is often stored in one or more memory blocks when the power is turned off. The defect list can then be read upon subsequent power on of the memory device. However, these memory blocks can also become defective and as result the defect list, or portion thereof, can be lost. Thus, some solutions store multiple copies of the defect list, but multiple copies can increase overhead and reduce the useable amount of memory available. Thus, it is desirable to implement at least some of the defect management in hardware.

SUMMARY

A simplified summary is provided herein to help enable a basic or general understanding of various aspects of exemplary, non-limiting embodiments that follow in the more detailed description and the accompanying drawings. This summary is not intended, however, as an extensive or exhaustive overview. Instead, the sole purpose of this summary is to present some concepts related to some exemplary non-limiting embodiments of the invention in a simplified form as a prelude to the more detailed description of the various embodiments of the invention that follows.

The disclosed subject matter relates to systems and/or methods that can facilitate bad block management in non-volatile memory devices, such as NAND and NOR flash memory devices. One or more memory blocks of the memory devices are associated with one or more additional, dedicated bits that facilitate determining whether the associated memory block is defective. These one or more additional bits, which can be called bad block bits, can be stored in a hardware-based mechanism in the memory device. Once a defect is detected in a memory block, at least one of the bad block bits can be set to indicate that the memory block is bad. If at least one of the bad block bits associated with a memory block indicates a defective memory block, access to that memory block can be prevented.

In accordance with an aspect of the disclosed subject matter, a bad blocks bit for a memory block can be initialized to indicate that the associated memory block is good. Testing can be performed before deployment to mark any defective memory blocks as a result of manufacturing defects. In accordance with other aspects, a memory block can be marked as defective when that memory block can no longer be written to or read from successfully.

In accordance with an aspect of the disclosed subject matter, since it is undesirable to have a defective bad block bit, the bad block bits can be located in storage locations of a different type than the memory cells used for storing user data. For example, the storage locations can have a larger lithography than the memory cells, store fewer bits, and/or be a write-once.

In accordance with another aspect of the disclosed subject matter, when garbage collection or user data storage operations are performed, the bad block bits can be used to determine which memory blocks are good to place data in. If a block is determined to be bad because an operation fails, at least one of the bad block bits can be set to indicate that the block is bad and a different memory block from a pool of good memory blocks can be used to complete the operation.

In accordance with one aspect, access to a defective memory block can be prevented for both user-type operations (e.g., reading/writing data to/from the host for the memory device) as well as management-type operations (e.g., garbage collection). In accordance with another aspect of the disclosed subject matter, access to a defective memory block can be prevented by mapping defective memory blocks as indicated by the bad block bit out of the logical memory address space for the memory device. In yet another aspect, access can be prevented by returning an error when an operation (e.g., a user operation or a management operation) is attempted to be performed on a defective memory block.

The following description and the annexed drawings set forth in detail certain illustrative aspects of the disclosed subject matter. These aspects are indicative, however, of but a few of the various ways in which the principles of the innovation may be employed and the disclosed subject matter is intended to include all such aspects and their equivalents. Other advantages and distinctive features of the disclosed subject matter will become apparent from the following detailed description of the innovation when considered in conjunction with the drawings.

DETAILED DESCRIPTION

Figure 1:
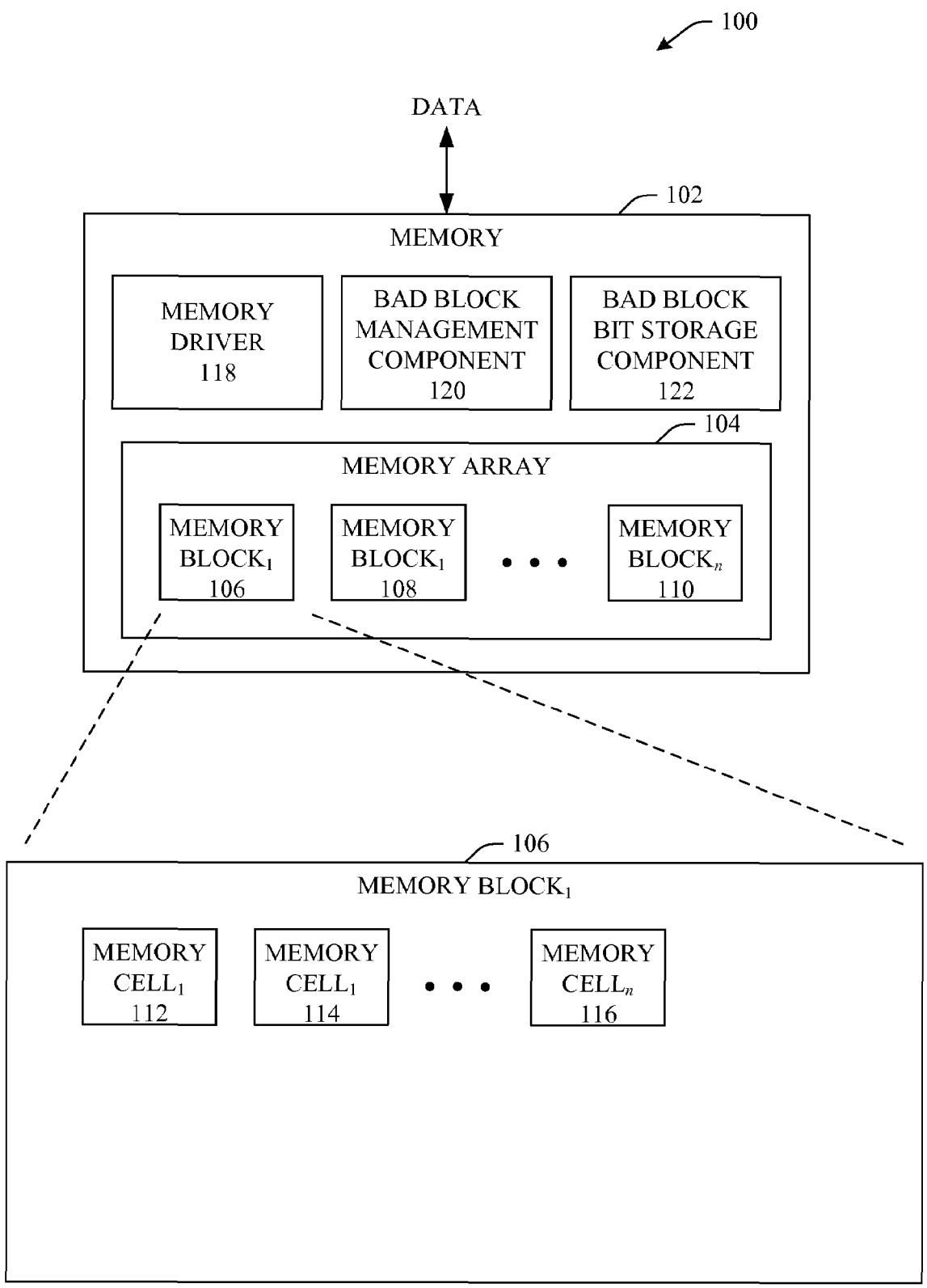
FIG. 1 illustrates a memory device according to one embodiment.

The disclosed subject matter is described with reference to the drawings, wherein like reference numerals are used to refer to like elements throughout. In the following description, for purposes of explanation, numerous specific details are set forth in order to provide a thorough understanding of the subject innovation. It may be evident, however, that the disclosed subject matter may be practiced without these specific details. In other instances, well-known structures and devices are shown in block diagram form in order to facilitate describing the subject innovation.

Conventionally, defective memory block management is implemented entirely in software, such as part of the memory driver or file system software. These software implementations, however, can be complex and hard to maintain. In addition, when the memory device is not powered, the software traditionally stores a list of defective memory blocks, called a defect list, inside one or more normal memory blocks of the memory device. However, these memory blocks, just like the other memory blocks of the memory cell, can become defective. Consequently, the defect list, or a significant portion of the defect list, can be lost if such memory blocks become defective.

Therefore, in accordance with one aspect of the disclosed subject matter, each of one or more memory blocks can be associated with one or more additional bits associated with a bad block bit storage component, which can be a hardware-based mechanism that can facilitate improved bad block management in the memory. The additional bits can be employed to facilitate indicating whether the associated memory block is defective. These additional dedicated bits can be referred to as bad block bits. Advantageously, the bad block bit storage component can comprise storage locations for storing bad block bits associated with a memory block (e.g., defective memory block) that is in the memory array. Such storage locations can be of a different type of storage that can be more reliable (e.g., less prone to failure or error) than the memory cell type used for the memory blocks in the memory array of the memory device. For example, a storage location can have a larger lithography or fewer bits per storage location. In addition, advantageously, the storage locations can be independently accessible and not part of a memory block. Consequently, since a defect list is no longer stored together in one or more memory blocks (e.g., memory blocks in the memory array), the risk of losing the defect list can be reduced and/or eliminated, as compared to conventional memory devices, where there was a risk that the memory block(s) that contained a block defect list could itself become defective and the defect list could be lost or corrupted as a result.

Turning to the figures, FIG. 1 illustrates an exemplary, non-limiting embodiment of a memory device 100. The memory device 100 can include a memory 102, which can comprise non-volatile memory (e.g., flash memory) and/or volatile memory (e.g., static random access memory (SRAM)), that can include a memory array(s) 104 (e.g., non-volatile memory array) that can be comprised of a plurality of memory blocks, depicted herein as memory block$_1$ 106, memory block$_2$ 108 and up through memory block$_n$ 110, where n can be an integer number. The memory 102 can receive data where, each memory block 106 through 110 can store data therein, for example, as part of a program operation. The memory 102 can also provide data stored therein as an output, for example, as part of a read operation. Data can also be erased from the memory cells, for example, as part of an erase operation, where the erase can be effectuated using an erase technique.

Each memory block can be comprised of a plurality of memory cells, depicted herein as memory cell$_1$ 112, memory cell$_2$ 114 and up through memory cell$_n$ 116, wherein n can be an integer number. In addition to the memory array 104, the memory 102 also includes a memory driver 118, which can be software or firmware that can facilitate control of an operation associated with the memory 102. The memory 102 can also comprise a bad block management component 120 that can use bad block bits that can be stored in a bad block bit storage component 122, which can be a hardware-based storage mechanism, to facilitate improved management of defective blocks in the memory 102. The bad block management component 120 is further described herein, for example, with regard to FIG. 3.

In accordance with one embodiment, the bad block bit storage component 122 can be contained within the memory 102. The storage locations in the bad block bit storage component 122 can contain one or more bits (not shown) that can be set (e.g., programmed) to indicate that an associated block in the memory array 104 is defective. For example, a value of 1 in a bad block bit can indicate that an associated memory block is defective, where a value of 0 in a bad block bit can indicate that the associated memory block is valid or not defective. In one aspect, the bad block bit storage component 122 can be a hardware-based mechanism.

One skilled in the art will appreciate that although only a single bit is described herein to indicate whether a memory block is defective or not, the subject innovation is not so limited, and multiple bits can be employed to facilitate marking a memory block as defective to facilitate bad block management, for example. Also, multiple storage locations for storage of a bad blocks bit for a single memory block can be present in various embodiments for redundancy and/or for ease of manufacture. For example, since it is possible that a storage location for a bad block bit can also be defective (e.g., due to manufacturing defects), it can be desirable to have multiple storage locations where a bad block bit can be stored.

Since it can be undesirable to have a defective bad block bit, the bad block bit storage component 122 can be comprised of one or more storage locations of a different type than the memory cells used for storing user data. For example, a larger lithography can be used for the storage location containing the bad block bits, a storage location that stores less bits, or a write-once storage location can be used in accordance with an aspect of the disclosed subject matter.

Although the bad block bit storage component 122 can be centralized for the entire memory device, according to another aspect the storage locations comprising the bad block bit storage component 122 can be distributed in multiple locations throughout the memory device. For example, an array of storage locations for bad block bits can be used for a predetermined number of memory blocks. Advantageously, by having multiple storage locations for the bad block bit storage component 122, manufacturing can be simplified.

Referring back to the memory 102, memory 102 can comprise nonvolatile and/or volatile memory. The nonvolatile memory can include, but is not limited to, read-only memory (ROM), flash memory (e.g., single-bit flash memory, multi-bit flash memory), mask-programmed ROM, programmable ROM (PROM), Erasable PROM (EPROM), Ultra Violet (UV)-erase EPROM, one-time programmable ROM, electrically erasable PROM (EEPROM), and/or nonvolatile RAM (e.g., ferroelectric RAM (FeRAM)). A flash memory can be comprised of NAND memory and/or NOR memory, for example. Volatile memory can include, but is not limited to, RAM, static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM).

Figure 2:
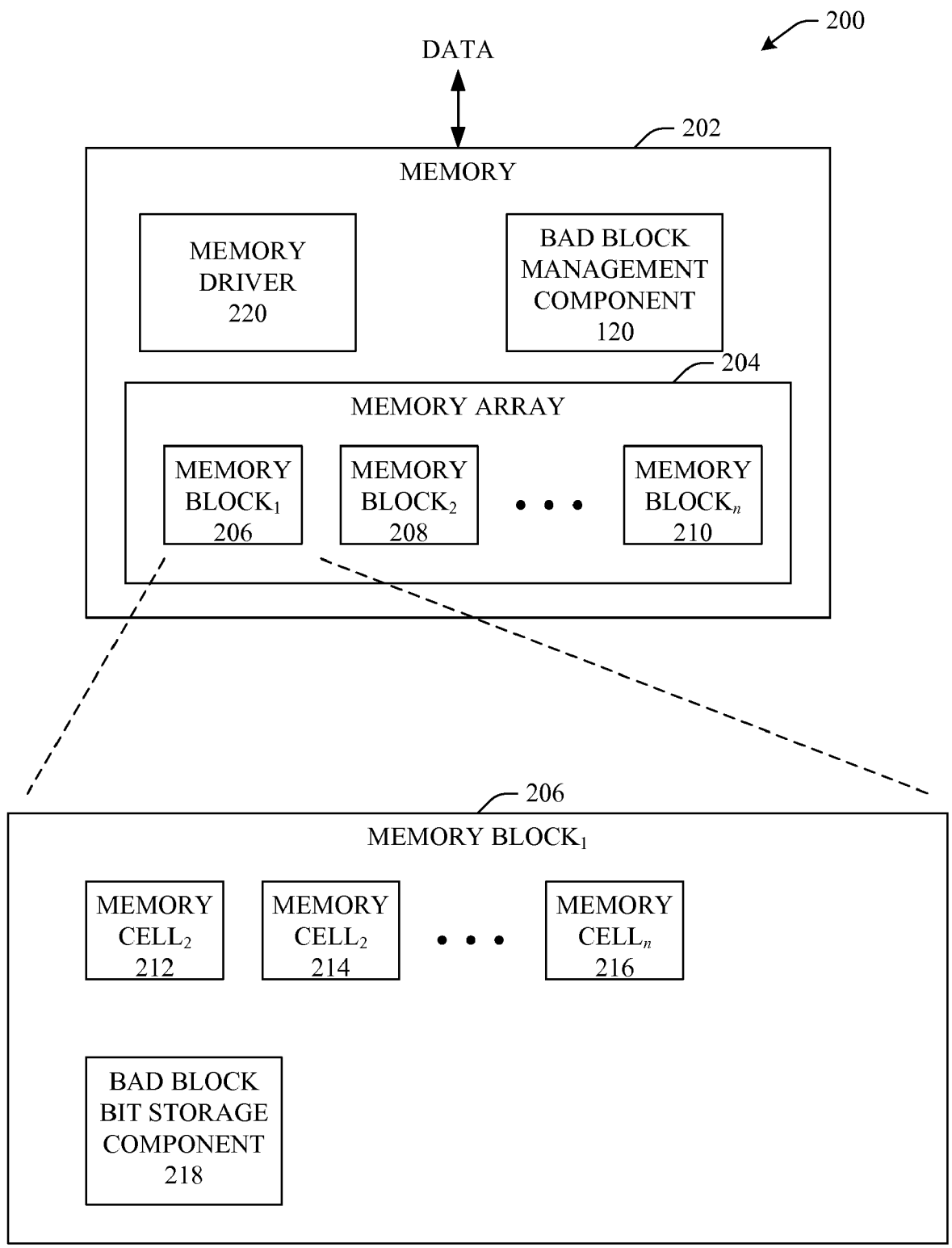
FIG. 2 illustrates a memory device according to another embodiment.

As another example embodiment, FIG. 2 illustrates an exemplary, non-limiting embodiment of a memory device 200. In one aspect, the memory device 200 can comprise a memory 202, which can comprise a non-volatile memory (e.g., flash memory) and/or volatile memory (e.g., SRAM), that can include a memory array(s) 204 (e.g., nonvolatile memory array) that can be comprised of a plurality of memory blocks, illustrated herein as memory block$_1$ 206, memory block$_2$ 208 and memory block$_n$ 210, where n can be an integer number. The memory 202 can receive data, store data, and/or provide data. For example, during a program operation, data can be received by the memory 202 and stored in one or more memory blocks (e.g., memory block 206), where each memory blocks can comprise one or more memory cells therein (e.g., memory cells 212-216). As another example, during a read operation, the memory 202 can provide data stored as an output. Data can also be erased from the memory cells, for example, as part of an erase operation.

Memory block 206 also comprises bad block bit storage component 218. The bad block bit storage component 218 can be an additional storage location inside of a memory block and advantageously a storage location of a different type than the rest of the memory block. The bad block bit storage 218 is in addition to bits used to store user data. Although not shown, one will appreciate that additional bit lines can be in communication with the bad block bit storage 218 so that the bad block storage 218 can be read from/written to independently of the bits lines for the memory block.

In addition to the memory array 204, the memory 202 can also include a memory driver 220, which can be software or firmware that can facilitate control of an operation(s) associated with the memory 202. The memory 202 can also comprise a bad block management component 120 that can use bad block bits stored in bad block bit storage 218 to facilitate defective blocks management at least partially in hardware.

Referring again to the memory 202, memory 202 can comprise nonvolatile and/or volatile memory. The nonvolatile memory can include, but is not limited to, read-only memory (ROM), flash memory (e.g., single-bit flash memory, multi-bit flash memory), mask-programmed ROM, programmable ROM (PROM), Erasable PROM (EPROM), Ultra Violet (UV)-erase EPROM, one-time programmable ROM, electrically erasable PROM (EEPROM), and/or nonvolatile RAM (e.g., ferroelectric RAM (FeRAM)). A flash memory can be comprised of NAND memory and/or NOR memory, for example. Volatile memory can include, but is not limited to, RAM, static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM).

Figure 3:
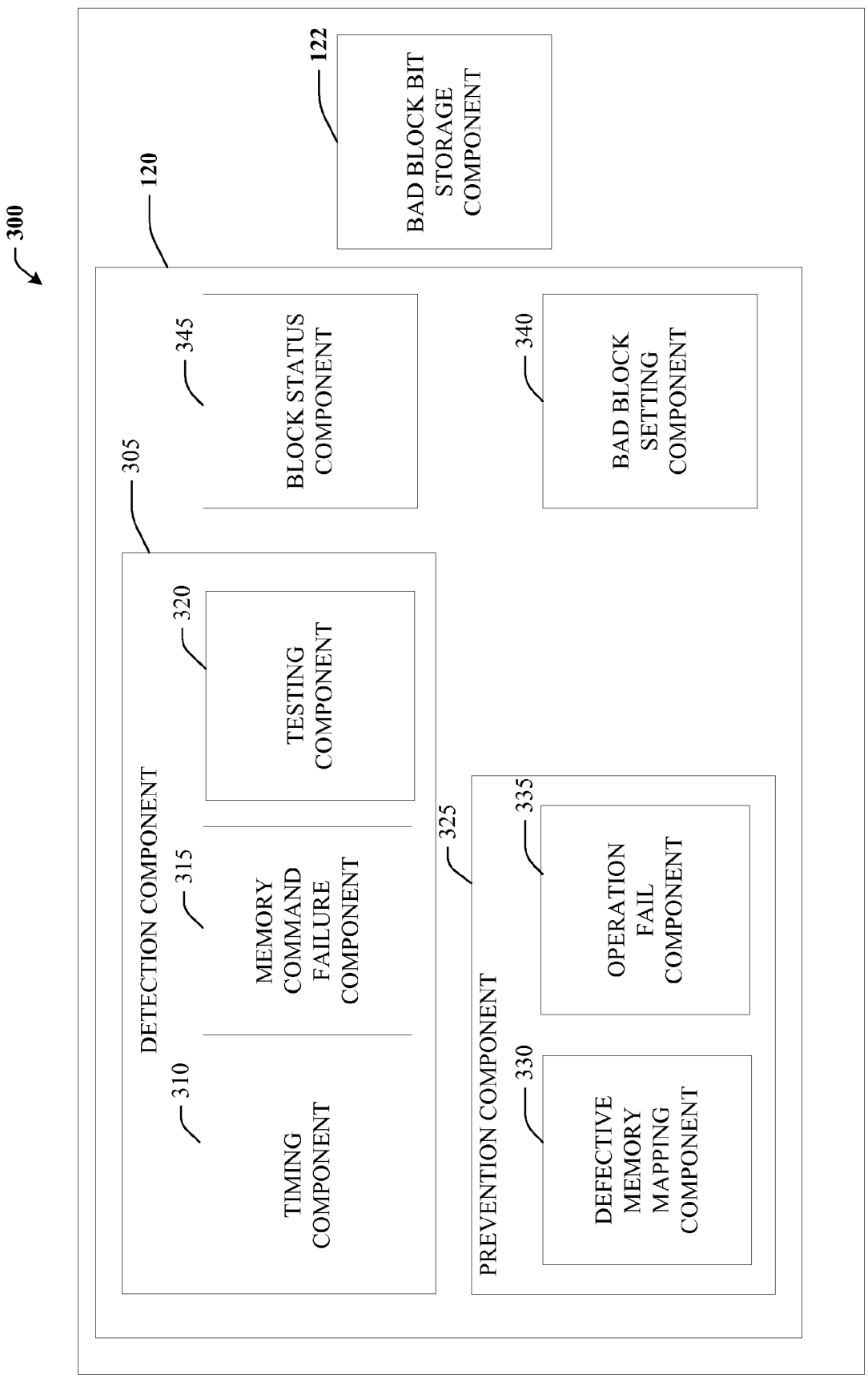
FIG. 3 is a block diagram of a system that can facilitate bad block management associated with a memory according to one aspect.

Referring to FIG. 3, illustrated is a system 300 that can facilitate management of bad blocks in a memory in accordance with an embodiment of the disclosed subject matter. In accordance with an aspect, system 300 can comprise a bad block management component 120 that can facilitate identifying and/or managing bad blocks associated with a memory 102 (e.g., as illustrated in FIG. 1 and described herein) and a bad block bit storage component 122 that can be used to store bad block bits. The bad block management component 120 and the bad block bit storage component 122 each can be the same or similar as, and/or can comprise the same or similar respective functionality as, respective components as described herein, for example, with regard to system 100.

In one aspect, the bad block management component 120 can comprise a detection component 305, which can facilitate detection of defective blocks. The detection component 305 can contain one or more subcomponents that can each facilitate identifying defective blocks in one or more manners. One will also appreciate that, in addition to detecting and/or identifying defective memory blocks, the detection component 305 can also detect and/or identify memory blocks that are bad and unreliable for other reasons. For example, in accordance with one aspect, the detection component 305 can detect and/or identify a memory block as bad or unreliable, and such memory block can be marked bad, if the integrity of the stored data is bad, such as when a memory block was erased/modified using UV light or in other non-conventional manners.

The detection component 305 can comprise a timing component 310, which can determine whether a memory is defective or becoming bad through wear based in part on the amount of time an operation takes to complete in a memory location in the memory block. If the amount of time exceeds a predetermined amount of time, the block can be determined to be defective. The predetermined amount of time can be constant for all operations or can be different based in part on the type of operation (e.g., read or write) actively being performed or the amount of data the operation is being performed upon, for example.

The detection component 305 can also comprise a memory command failure component 315. The memory command failure component 315 can detect defective blocks when an operation (e.g., a CFI/ONFI operation) on the memory block fails. For example, an error status can be indicated as the result of the operation being performed. In accordance with one aspect, a predetermined number of failures can occur before a memory block is identified as defective, as desired, such as to account for temporary environmental conditions that can prevent the operation from occurring successfully.

The detection component 305 can also comprise a testing component 320. A testing component 320 can test one or more memory blocks by writing known test data to a memory block and then reading the written data back. If the data read is not the known test data, the memory block can be determined to be defective. Advantageously, the testing component 320 can be utilized after manufacturing to detect any defective memory blocks due to manufacturing defects.

The bad block management component 120 can also comprise a prevention component 325. The prevention component 325 can be implemented in hardware, software, firmware, or a combination thereof. The illustrated prevention component 325 can comprise a defective memory mapping component 330. The defective memory mapping component 330 can prevent access to the defective memory blocks by mapping defective blocks out of the logical memory address space. In addition, the illustrated prevention component 325 can also comprise an operation fail component 335 that can facilitate generating an error message if access is attempted to a memory block is marked as defective based on the bad block bits. One will appreciate that prevention can according to other aspects comprises either the operation fail component 330 or the defective memory mapping component 335. One will also appreciate though that access to the defective memory blocks can be prevented in other manners known in the art.

The bad block management component 120 can also comprise a bad block setting component 340. The bad block setting component 340 can set the associated bad block bit for an indicated memory block to indicate that a block is defective. For example, the bad block setting component 340 can use CFI/ONFI operations to set the bad block in the bad block storage component 122 when a memory block is determined to be defective by the detection component 305 (or one of its subcomponents). Advantageously, the bad block setting operation can be performed in a manner so that the bit is permanently set. Thus, a higher voltage than that used to program a bit in a memory block can be used in one embodiment. The bad block setting component 340 can be invoked by the detection component 305 after identifying a defective memory block.

The bad block management component 120 can further comprise a block status component 345. The block status component 345 can provide information about memory blocks to other components, such as the memory driver 118. The information can include the number of defective blocks, pools of good blocks, pools of defective blocks, and whether an indicated block is good or defective. The information in turn can be utilized in various manners, such as whether the manufacture should ship the memory device or used to facilitate operations, such as garbage collection. As an example, the block status component 345 can be used by the memory driver 118 in the process of performing management-type functions, such as reclaiming blocks (e.g., garbage collection).

FIGS. 4-9 illustrate methodologies and/or flow diagrams in accordance with the disclosed subject matter. For simplicity of explanation, the methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts may be required to implement the methodologies in accordance with the disclosed subject matter. In addition, those skilled in the art will understand and appreciate that the methodologies could alternatively be represented as a series of interrelated states via a state diagram or events. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device, carrier, or media.

Figure 4:
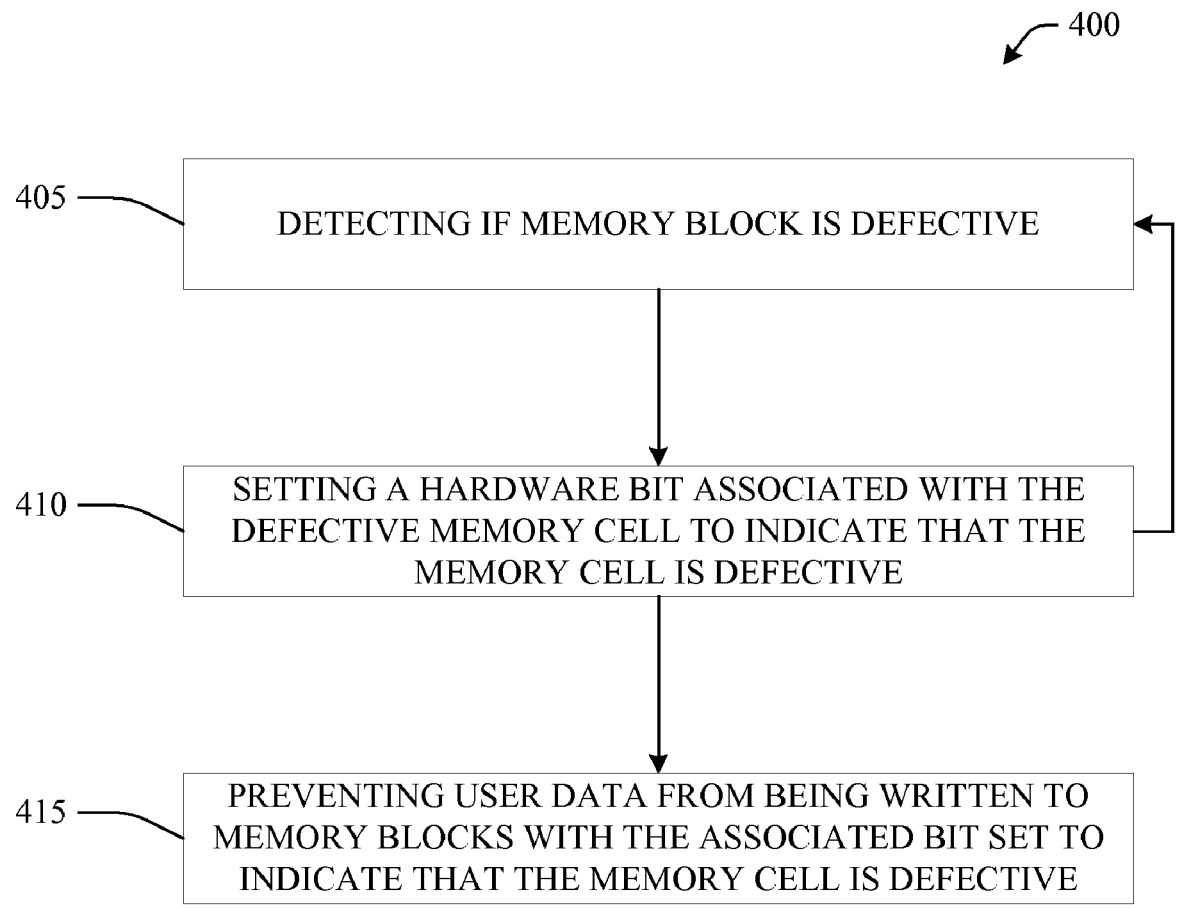
FIG. 4 is a flowchart for a methodology of managing bad blocks associated with a memory in accordance with an aspect.

Referring to FIG. 4, a methodology 400 for facilitating bad block management in accordance with the disclosed subject matter is illustrated. At 405, detection of defective memory blocks can be performed. As discussed supra, the detection can be performed in various manners, such as if a read or write CFI/ONFI operation fails on a memory block or based in part on the amount of time taken to perform the operation. For example, the detection component 305 can be used to facilitate detecting defective blocks. At 410, a bit associated with the defective memory block can be set to indicate that the memory block is defective. In one aspect, a bad block setting component 340 can facilitate setting the bit associated with the defective memory block to indicate that the memory block is defective. At 415, user data can be prevented from being written to such memory blocks that have the bit set as being defective. For example, the prevention component 325 can be used to facilitate preventing access to memory blocks whose associated bad block bit indicates that a memory block is defective. In particular, user data can be prevented from being written, for example, by mapping those memory blocks out of the logical memory address space.

Figure 5:
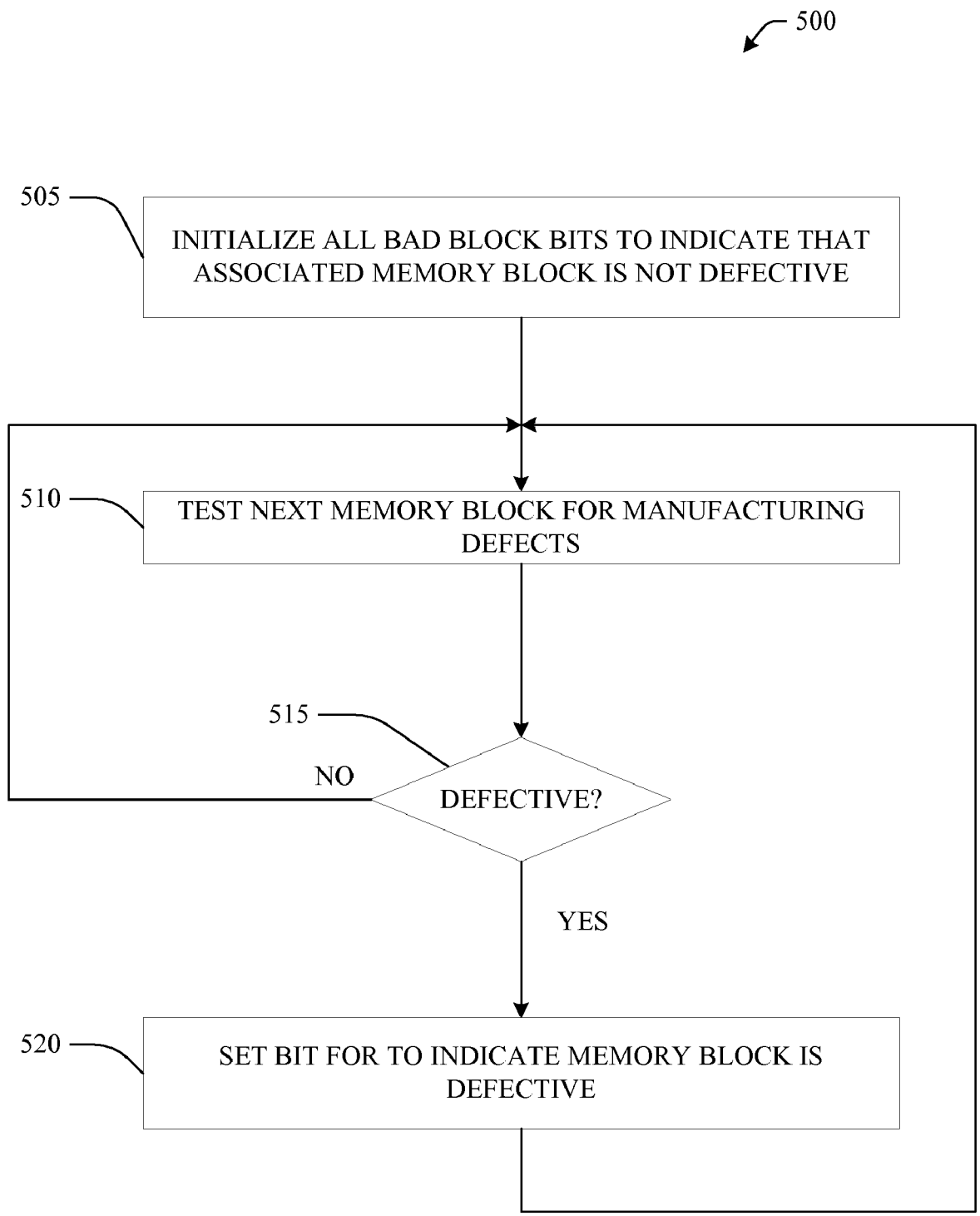
FIG. 5 is a flowchart for a methodology for initial testing and marking of defective memory blocks in a memory due to manufacturing defects to facilitate bad block management in accordance with one aspect.

Referring to FIG. 5, a methodology 500 for marking defective memory blocks due to manufacturing defects in accordance with the disclosed subject matter is illustrated. For instance, the methodology can be implemented as part of the testing component 320. At 505, bad blocks bits can be initialized to facilitate determining whether indicate that the associated memory block is not defective. For example, each bad bit block can be initialized to facilitate determining whether a memory block is defective. At 510, a memory block can be tested for manufacturing defects. For example, test data can be written to and read from each memory block. If either operation fails or the test data written does not match the data read back from the memory block, the memory block can be determined to be defective. In addition, the operations can be timed and if an operation exceeds a predetermined amount of time, the memory block can be determined to be defective. At 515, a determination can be made as to whether the tested memory block is defective. If the memory block is determined to be defective at 515, at 520, the associated bad block bit in the bad block bit storage component 122 for the tested memory block can be set to indicate the memory block is defective. For example, the bad block setting component 340 can facilitate programming the block bit s that the tested block is marked defective. If the memory block is determined to be non-defective or after setting the bad block bit for the tested memory block, the next block can be tested at 510.

Figure 6:
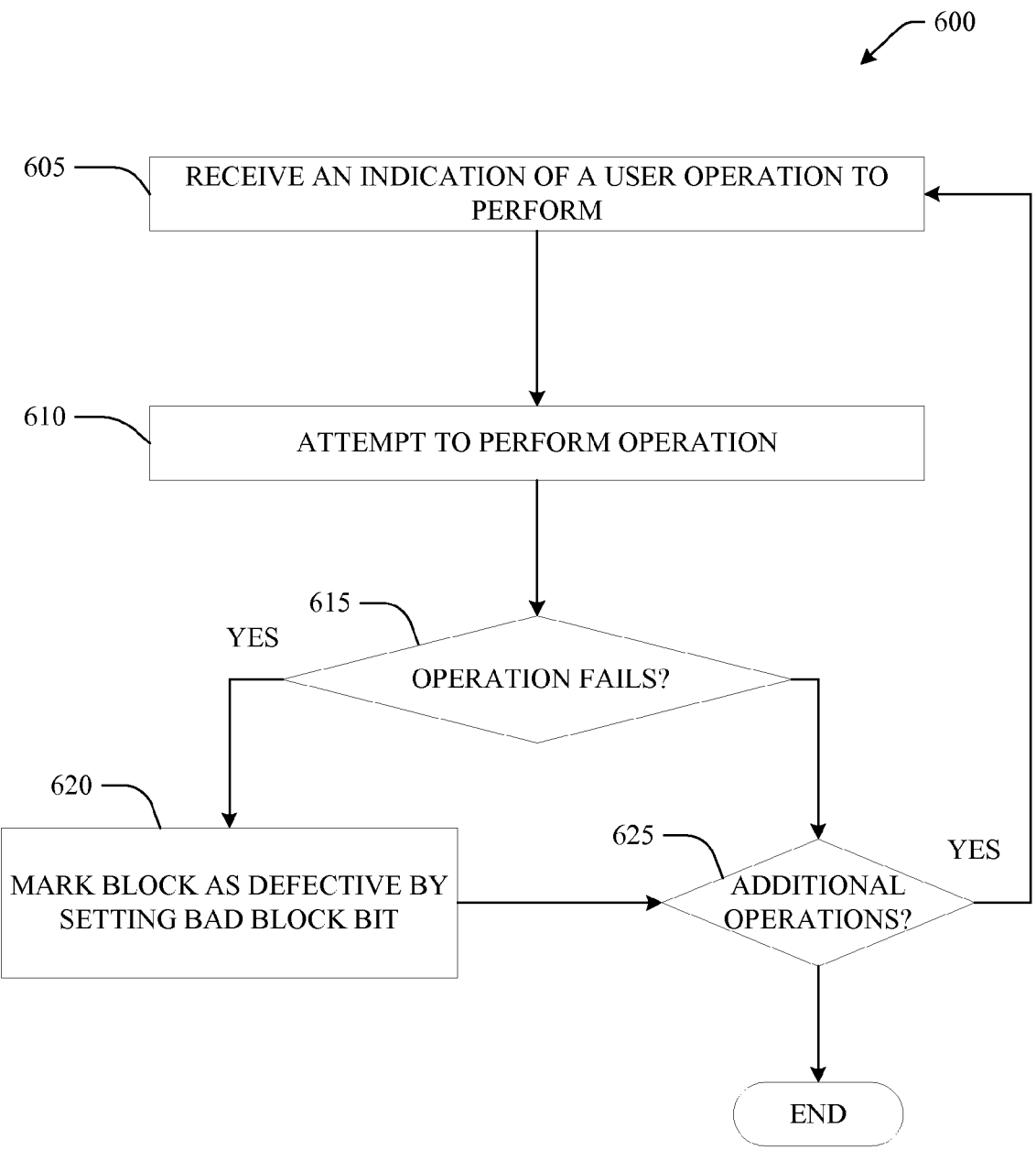
FIG. 6 is a flowchart for methodology that can facilitate managing bad blocks associated with an operation associated with a memory in accordance with one aspect.

Turning to FIG. 6, depicted is a methodology 600 of detecting bad blocks in a memory during operations (e.g., read data from the memory device or write data to the memory device) in accordance with an aspect of the disclosed subject matter. At 605, there can be an indication to perform an operation (e.g., read, write, erase, verify), where the indication can be provided via the memory driver (e.g., 118), for example. For example, the operation to perform can be to write data in one or more memory blocks or retrieve previously stored data from one or more memory blocks in the memory (e.g., memory 102). At 610, an attempt can be made to perform the operation.

At 615, a determination can be made regarding whether the operation failed. For example, the determination can be based in part on a status code received from performing a CFI/ONFI operation or based in part on whether the amount of time to perform the operation exceeded a predetermined amount of time (e.g., an excessive amount of time elapsed), where the operation can be deemed to have failed if it takes more than the predetermined amount of time to perform the operation. If it is determined that the operation failed, at 620, the memory block can be marked as defective by setting a bad block bit associated with the memory block accordingly, and methodology 600 can proceed to reference numeral 625. In accordance with one embodiment, the operation can be attempted to be performed again automatically, such as on another memory block. For example, if the operation relates to writing data to a memory block, then according to one aspect, an attempt can be made to write the data to another free, non-defective memory block. If it is determined that the operation did not fail or after marking the block as defective, at 625, a determination can be made regarding whether there is an additional operation(s) to perform. If there is an additional operation(s) to perform, methodology 600 can return to reference numeral 605 to perform another operation. If, at 625, it is determined that there is not another operation to perform, the methodology 600 can end.

Figure 7:
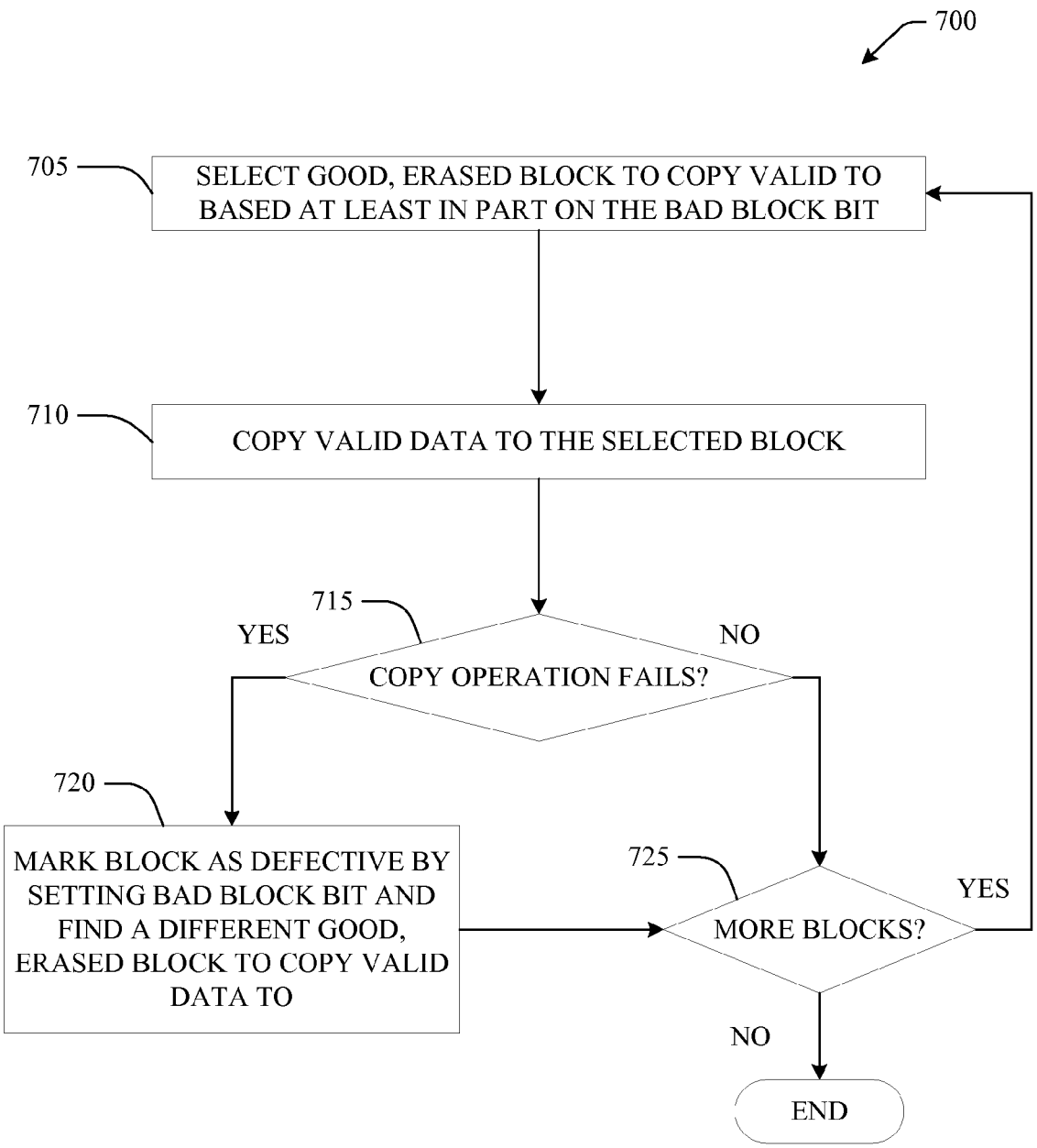
FIG. 7 is a flowchart of a methodology that can facilitate managing bad blocks associated with a management-type operation associated with a memory in accordance with one aspect.

Referring to FIG. 7, depicted is a methodology 700 that can facilitate managing bad blocks in a memory during management-type operation associated with the memory in accordance with an aspect of the disclosed subject matter. In one aspect, the management-type operation can be an operation that can facilitate reclaiming blocks associated with the memory. Although reclaiming of blocks of memory is illustrated, it is an exemplary management-type operation that can be performed during use of the memory device (e.g., 100 of FIG. 1) in which defective memory blocks can be detected. One skilled in the art will appreciate that other management-type operations, such as wear-leveling can also result in operation failures such that a memory block can be determined to be defective and/or marked as defective.

At 705, an erased memory block (e.g., available memory block) can be selected based in part at least on the bad block bits in the bad block storage component 122, which can be set so as to indicate that the erased memory block is not marked defective. For example, if the bad block bit indicates that a memory block is defective, the memory block is not selected. In addition to selecting a non-defective memory block, erased blocks can be determined and/or selected from a list of erased blocks (e.g., as maintained by the block status component 340). At 710, data can be copied to the memory block that is selected.

At 715, a determination can be made as to whether the copy operation failed. The determination as to whether the copy operation failed can be made based in part on an error being indicated or on the operation taking more than a predetermined amount of time to be performed (e.g., an excessive amount of time taken to perform the operation), where the operation can be deemed to have failed if it takes more than the predetermined amount of time to be completed. If it is determined that the copy operation failed, at 720, the memory block can be marked as defective by setting the bad block bit (e.g., in the bad block bit storage component 122) accordingly, and a different non-defective, erased memory block can be identified and the valid data can be copied to such non-defective, erased memory block (e.g., available memory block). If it is determined that the copy operation did not fail or after marking the defective block, at 725, a determination can be made as to whether another management-type operation is to be performed (e.g., whether there is another memory block(s) that is to be reclaimed), and if so, the methodology 700 can return to reference numeral 705 to perform another management-type operation (e.g., reclaim the next memory block). If, at 725, it is determined that there is no other operation (e.g., reclaiming operation to reclaim memory block(s)) to be performed, the methodology 700 can end.

Figure 8:
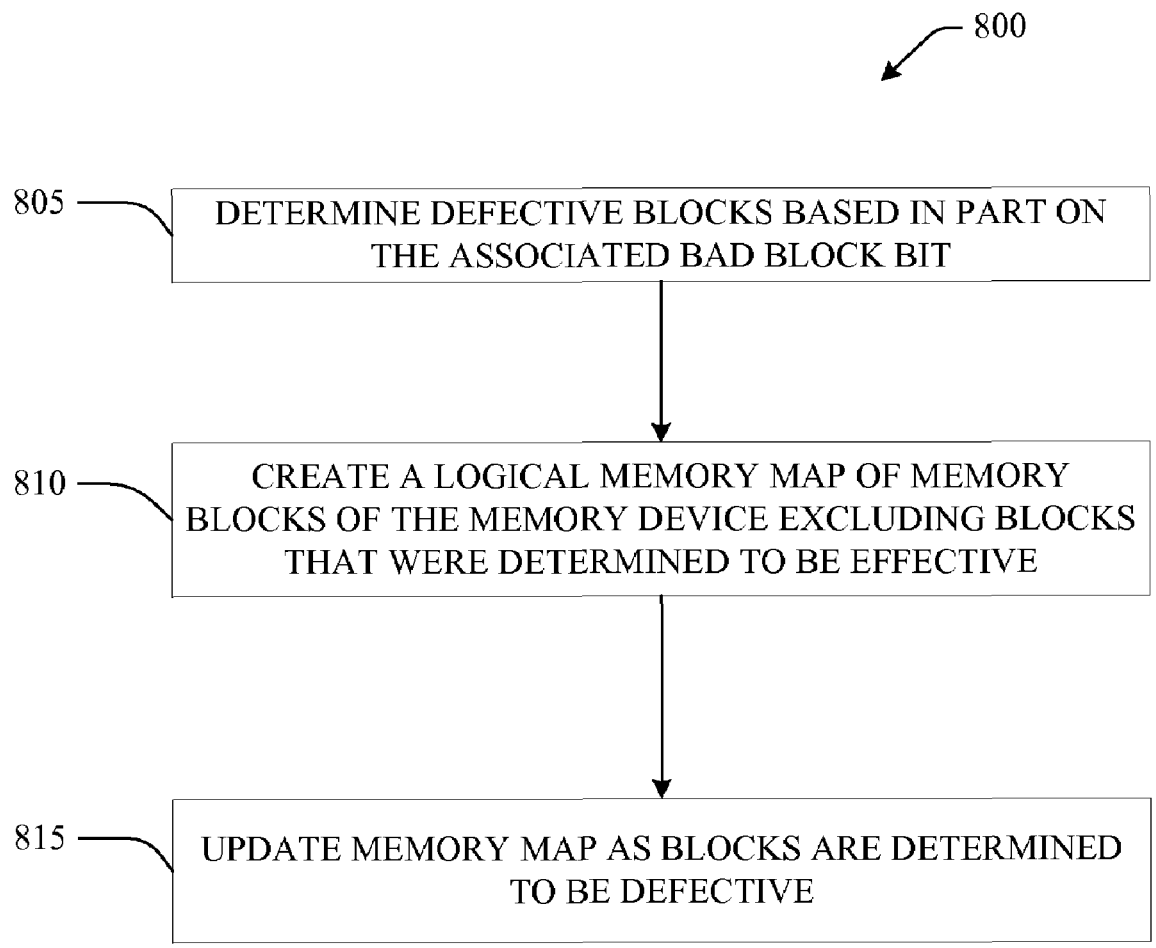
FIG. 8 is a flowchart of a methodology that can prevent access to defective blocks by mapping defective blocks out of the logical memory map associated with a memory in accordance with one aspect.
Figure 9:
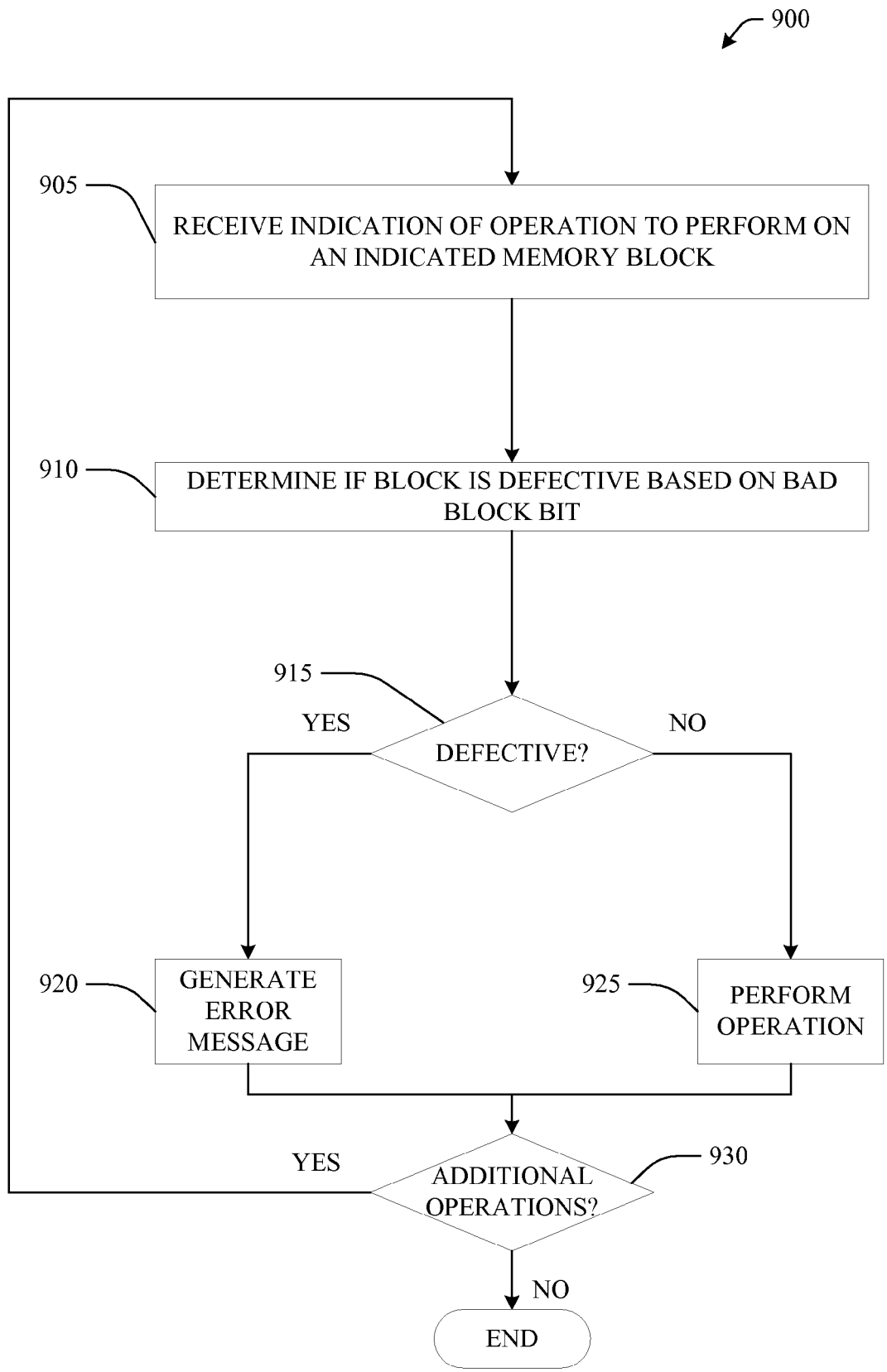
FIG. 9 is a flowchart of another methodology that can prevent access to defective blocks associated with a memory in accordance with an aspect of the disclosed subject matter.

FIGS. 8 and 9 illustrate exemplary methodologies that can facilitate preventing access to defective blocks, such as determined in part by the one or more bad block bits stored in the bad block bit storage component 122. One or more of these methodologies can be performed by components associated with the prevention component 325. One will appreciate, however, that other methods known in the art for preventing access to defective blocks can alternatively be used.

Referring to FIG. 8, depicted is a methodology 800 that can facilitate preventing access to defective blocks in accordance with an embodiment of the disclosed subject matter. Methodology 800 can be performed, for example, when the memory device is first powered on, such as by the defective memory mapping component 330. At 805, defective memory blocks can be determined based in part on the bad block bits respectively associated with the memory blocks in a memory (e.g., memory 102). For example, the defective memory mapping component 330 can read the bad block bits from the bad block bit storage component 122 for each memory block of the memory device and can create a defect list that can include the memory blocks that are defective. One skill in the art will appreciate that the defective memory mapping component 330 can alternatively create a list of non-defective blocks instead of or in addition to the list of defective memory blocks.

At 810, a logical memory map of the memory blocks of the memory device can be created. In one aspect, the logical memory map can map defective blocks out of the address space for the memory device. The defective memory mapping 330 can create the logical memory map giving the first non-defective memory block accessible to a user a logical address of zero and giving the next memory block a logical address that is 1 greater than the last logical memory access of the previous block. Thus, the capacity of the non-defective blocks as well as the space available from unused non-defective blocks can be determined and/or perceived. The defective blocks, however, can be available to the user and their capacity can be hidden. At 815, the logical memory map can be updated as additional blocks are determined to be defective. For example, defective memory mapping component 330 can map the last non-defective block into the old logical memory address of the newly defective block. Thus, the user continues to only see non-defective memory blocks even if one or more memory blocks become defective during operation of the memory device. At this point, methodology 800 can end.

Referring to FIG. 9, depicted is another methodology 900 that can facilitate preventing access to defective blocks in accordance with another embodiment of the disclosed subject matter. According to one aspect, facilitating management of access to defective blocks can be implemented in hardware (e.g., operation fail component 335). At 905, an indication to perform an operation on an indicated memory block can be received. For example, the memory driver 104 can receive the indication from an electronic device that utilizes the memory device to read/write data from/into the memory array. The memory driver 104 can facilitate determining memory blocks that are associated with the operation.

At 910, a determination can be made regarding whether the indicated memory block is defective based in part on a bad block bit associated with the memory block. If the associated bad block bit indicates that the memory block is defective, at 920, an error message can be generated and sent. The error message can be sent back to the memory driver so another block can be determined for the operation if appropriate (e.g., when data is being written to a defective memory block). As another example, the error message can instead be sent to an electronic device utilizing the memory. If it is determined that the memory block is not defective, at 925, the operation can be performed. At 930, a determination is made whether there is another operation(s) to perform. If it is determined that there is another operation(s) to be performed, methodology 900 can return to reference numeral 905 and can proceed from that point. If it is determined there is not another operation(s) to be performed, methodology 900 can end.

Figure 10:
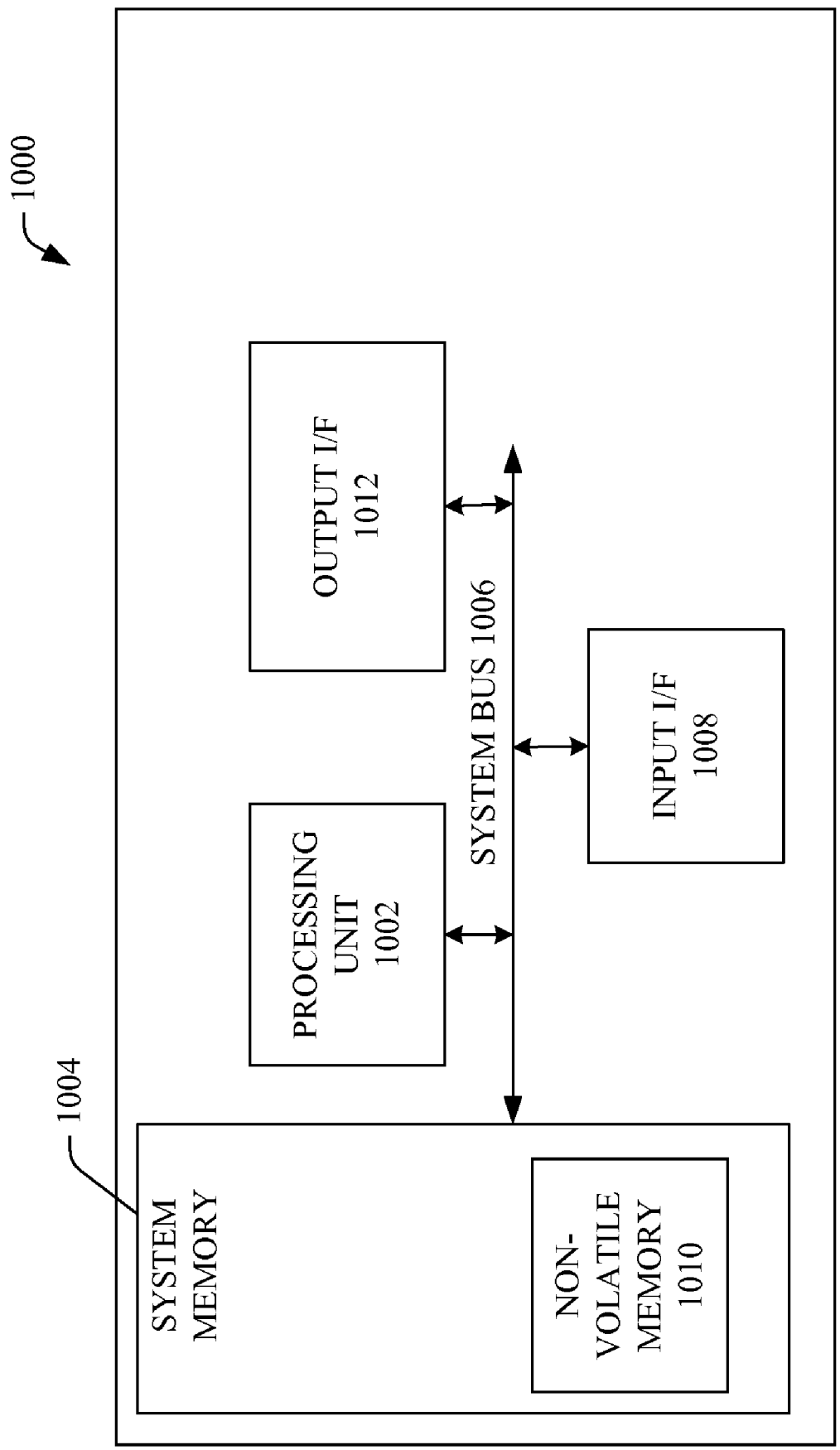
FIG. 10 is a block diagram of an exemplary electronic device that utilizes the memory system.

Referring to FIG. 10, a block diagram of an exemplary, non-limiting electronic device 1000 that can utilize a memory device is illustrated. The memory device employed in electronic device can be a non-volatile memory device, such as any of the memory devices described herein, including, for example, memory device 100 or memory device 200.

The electronic device 1000 can be, but is not limited to, a computer, a laptop computer, network equipment (e.g. routers, access points), a media player and/or recorder (e.g., audio player and/or recorder, video player and/or recorder), a television, a smart card, a phone, a cellular phone, a smart phone, an electronic organizer, a PDA, a portable email reader, a digital camera, an electronic game (e.g., video game), an electronic device associated with digital rights management, a Personal Computer Memory Card International Association (PCMCIA) card, a trusted platform module (TPM), a Hardware Security Module (HSM), a set-top box, a digital video recorder, a gaming console, a navigation system or device (e.g., global position satellite (GPS) system), a secure memory device with computational capabilities, a device with a tamper-resistant chip(s), an electronic device associated with an industrial control system, an embedded computer in a machine (e.g., an airplane, a copier, a motor vehicle, a microwave oven), and the like.

Components of the electronic device 1000 can include, but are not limited to, a processing unit 1002, a system memory 1004, and a system bus 1006 that can couple various system components including the system memory 1004 to the processing unit 1002. The system bus 1006 can be any of several types of bus structures including a memory bus or memory controller, a peripheral bus, or a local bus using any of a variety of bus architectures.

Electronic device 1000 can typically include a variety of computer readable media. Computer readable media can be any available media that can be accessed by the electronic device 1000. By way of example, and not limitation, computer readable media can comprise computer storage media and communication media. Computer storage media includes volatile and non-volatile, removable and non-removable media implemented in any method or technology for storage of information such as computer readable instructions, data structures, program modules or other data. Computer storage media includes, but is not limited to, RAM, ROM, EEPROM, non-volatile memory (e.g., 1010) or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by electronic device 1000. Communication media typically embodies computer readable instructions, data structures, program modules or other data in a modulated data signal such as a carrier wave or other transport mechanism and includes any information delivery media. A basic input/output system (BIOS), containing the basic routines that help to transfer information between elements within electronic device 1000, such as during start-up, can be stored in the system memory 1004. The system memory 1004 typically also contains data and/or program modules that can be immediately accessible to and/or presently be operated on by processing unit 1002. By way of example, and not limitation, system memory 1004 can also include an operating system, application programs, other program modules, and program data.

The system memory 1004 can include computer storage media in the form of volatile and/or nonvolatile memory, such as non-volatile memory 1010 (e.g., memory device 100, memory device 200). The non-volatile memory 1010 can be a flash memory (e.g., single-bit flash memory, multi-bit flash memory), read only memory (ROM), programmable ROM (PROM), electrically programmable ROM (EPROM), electrically erasable programmable ROM (EEPROM), and the like. Further, the flash memory can be comprised of NOR flash memory and/or NAND flash memory. The non-volatile memory 1010 can be removable or non-removable. For example, the non-volatile memory 1010 can be in the form of a removable memory card or a USB flash drive.

A user can enter commands and information into the electronic device 1000 through input devices (not shown) such as a keypad, microphone, tablet or touch screen although other input devices can also be utilized. These and other input devices can be connected to the processing unit 1002 through input interface 1008 that can be connected to the system bus 1006. Other interface and bus structures, such as a parallel port, game port or a universal serial bus (USB) can also be utilized. A graphics subsystem (not shown) can also be connected to the system bus 1006. A display device (not shown) can be also connected to the system bus 1010 via an interface, such as output interface 1010, which can in turn communicate with video memory. In addition to a display, the electronic device 1000 can also include other peripheral output devices such as speakers (not shown), which can be connected through output interface 1012.

The aforementioned devices and/or systems have been described with respect to interaction between several components. It should be appreciated that such systems and components can include those components or sub-components specified therein, some of the specified components or sub-components, and/or additional components. Sub-components could also be implemented as components communicatively coupled to other components rather than included within parent components. Further yet, one or more components and/or sub-components may be combined into a single component providing aggregate functionality. The components may also interact with one or more other components not specifically described herein for the sake of brevity, but known by those of skill in the art.

The word "exemplary" is used herein to mean serving as an example, instance, or illustration. For the avoidance of doubt, the subject matter disclosed herein is not limited by such examples. In addition, any aspect or design described herein as "exemplary" is not necessarily to be construed as preferred or advantageous over other aspects or designs, nor is it meant to preclude equivalent exemplary structures and techniques known to those of ordinary skill in the art. Furthermore, to the extent that the terms "includes," "has," "contains," and other similar words are used in either the detailed description or the claims, for the avoidance of doubt, such terms are intended to be inclusive in a manner similar to the term "comprising" as an open transition word without precluding any additional or other elements.

While the subject innovation has been described in connection with the preferred embodiments of the various figures, it is to be understood that other similar embodiments can be developed or modifications and additions can be made to the described embodiment for performing the same function in accordance with the disclosed subject matter without deviating therefrom.

For example, one will appreciate that since the one or more storage locations for bad block bits in the bad block bit storage component 122 can also become defective and thus can incorrectly indicate that a defective memory block is non-defective, in some applications it can be desirable to use a hybrid of both the disclosed hardware defect management and a conventional software defect management. For example, in applications where the failure of the memory device could lead to disastrous consequences (e.g., loss of a control systems for a nuclear plant or loss of a navigation system for an aircraft), it can be desirable to use multiple defect management approaches. Thus, a memory block can be considered defective and not used if either approach indicates that a block is defective.

What is claimed is:

1. A memory device, comprising:
   a plurality of memory blocks, wherein one or more of the memory blocks each have an associated bit that indicates whether the associated memory block is defective and the associated bit is stored in a storage location that is of a different type than a memory cell of the memory block, and wherein the associated bit is a write-once bit; and
   a bad block management component that detects a memory block is defective based at least in part on whether a command operating on the memory block exceeds a predetermined amount of time and sets the associated bit to indicate the associated memory block is defective.

2. The memory device of claim 1, further comprising:
   a defective memory mapping component that maps memory blocks with an associated bit indicating that the memory block is bad out of a logical address space for the memory device.

3. The memory device of claim 1, further comprising a bad block bit storage component that includes a plurality of storage locations respectively associated with the plurality of memory blocks, the associated bit is stored in a storage location associated with a memory block, the bad bit storage component is a hardware-based mechanism.

4. The memory device of claim 1, each memory block comprises a plurality of memory cells, the memory cells are of a first type, and the associated bit is stored in a storage location of a second type that is different than the first type.

5. The memory device of claim 4, the second type is at least one of a second type that has a larger lithography than the first type or stores less bits than the first type, or a combination thereof.

6. The memory device of claim 1, the bad block management component detects a memory block is defective based at least in part on whether a command operating on a memory block returns a status of failed, the command is at least one of a read command or a write command.

7. An electronic device comprising the memory device of claim 1.

8. The electronic device of claim 7, wherein the electronic device comprises at least one of a computer, a laptop computer, network equipment, a media player, a media recorder, a television, a smart card, a phone, a cellular phone, a smart phone, an electronic organizer, a personal digital assistant, a portable email reader, a digital camera, an electronic game, an electronic device associated with digital rights management, a Personal Computer Memory Card International Association (PCMCIA) card, a trusted platform module (TPM), a Hardware Security Module (HSM), set-top boxes, a digital video recorder, a gaming console, a navigation system, a secure memory device with computational capabilities, a device with at least one tamper-resistant chip, an electronic device associated with industrial control systems, or an embedded computer in a machine, or a combination thereof, wherein the machine comprises one of an airplane, a copier, a motor vehicle, or a microwave oven.

9. A method for indicating bad blocks in a memory device, comprising:
   detecting if a memory block of a plurality of memory blocks in the memory device is defective, each memory block associated with a dedicated bit to facilitate indicating whether the block is defective; and
   setting the bit associated with the defective memory cell to facilitate indicating that the memory block is defective, wherein the bit is in a storage location that is of a different type than a memory cell type of the memory block, wherein the setting of the bit associated with the defective memory cell to indicate that the memory block is defective comprises setting a write once bit.

10. The method of claim 9, the detecting if a memory block of the plurality of memory blocks in the memory device is defective comprises testing each of the plurality of memory blocks after manufacture for manufacturing defects.

11. The method of claim 9, the detecting if a memory block of the plurality of memory blocks in the memory device is defective comprises detecting if a command operating on a memory block fails.

12. The method of claim 9, further comprising preventing user data from being written to a memory block associated with a bit indicating that the memory block is defective.

13. The method of claim 12, the preventing of user data being written to a memory block associated with a bit indicating that the memory block is defective comprises mapping the memory block associated with a bit indicating that the memory block is defective out of the logical address space for the memory device.

14. The method of claim 9, further comprising initializing each of the associated bits to indicate that the associated memory block is not defective.

15. The method of claim 9, further comprising:
   receiving an indication to perform an operation;
   performing the operation;
   determining if the operation is performed successfully; and
   setting a bad block bit associated with a memory block associated with the operation if is it determined that the operation is not performed successfully.

16. The method of claim 9, further comprising:
   determining one or more memory blocks are defective based in part on settings of respectively associated based block bits;
   creating a logical memory map associated with the plurality of memory blocks that excludes defective memory blocks; and
   updating the logical memory map to exclude at least one memory block when the at least one memory block is determined to be defective.

17. A memory apparatus, comprising:
   a plurality of memory blocks of a first type of memory cell;
   a plurality of write-once bits of a second type of memory cell, wherein each of the plurality of bits is associated with a corresponding one of the plurality of memory blocks; and
   a bad block management component that detects a defective memory block and sets the associated bit to indicate the associated memory block is defective.

18. The memory apparatus of claim 17, wherein the second type of memory cell has a larger lithography than the first type.

19. The memory apparatus of claim 17, wherein the bad block management component detects a memory block is defective based at least in part on whether a command operating on a memory block returns a status of failed, the command is at least one of a read command or a write command.

20. An electronic device comprising the memory apparatus of claim 17.

* * * * *